US011152571B2

(12) United States Patent
Leobandung

(10) Patent No.: US 11,152,571 B2
(45) Date of Patent: Oct. 19, 2021

(54) COMPACT RESISTIVE RANDOM ACCESS MEMORY INTEGRATED WITH A PASS GATE TRANSISTOR

(71) Applicant: INTERNATIONAL BUSINESS MACHINES CORPORATION, Armonk, NY (US)

(72) Inventor: Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/843,639

(22) Filed: Apr. 8, 2020

(65) Prior Publication Data
US 2020/0235295 A1 Jul. 23, 2020

Related U.S. Application Data

(62) Division of application No. 16/020,380, filed on Jun. 27, 2018, now Pat. No. 10,672,983.

(51) Int. Cl.
H01L 45/00 (2006.01)
H01L 27/24 (2006.01)
G11C 13/00 (2006.01)

(52) U.S. Cl.
CPC ...... H01L 45/1675 (2013.01); G11C 13/0007 (2013.01); H01L 27/2436 (2013.01); H01L 45/1233 (2013.01); H01L 45/146 (2013.01); H01L 45/1616 (2013.01)

(58) Field of Classification Search
CPC ............ H01L 45/1233; H01L 45/146; H01L 45/1616; H01L 45/1675; H01L 27/2436; G11C 13/0007; G11C 2213/79
See application file for complete search history.

(56) References Cited

U.S. PATENT DOCUMENTS

| 6,849,891 | B1 | 2/2005 | Hsu et al. |
| 8,791,444 | B2 | 7/2014 | Chin et al. |
| 9,461,245 | B1 | 10/2016 | Yang et al. |
| 2005/0263801 | A1* | 12/2005 | Park .................... H01L 27/2436 257/288 |

(Continued)

OTHER PUBLICATIONS

List of IBM Patents or Patent Applications Treated as Related dated Apr. 8, 2020, 2 pages.

(Continued)

Primary Examiner — Allison Bernstein
(74) Attorney, Agent, or Firm — Tutunjian & Bitetto, P.C.; Randall Bluestone

(57) ABSTRACT

A method of forming a resistive random access memory (ReRAM) device is provided. The method includes depositing a lower cap layer on a substrate, depositing a dielectric memory layer on the lower cap layer, and depositing an upper cap layer on the dielectric memory layer. The method further includes removing portions of the lower cap layer to form a lower cap slab, dielectric memory layer to form a dielectric memory slab on the lower cap slab, and upper cap layer to form an upper cap slab on the dielectric memory slab, wherein the lower cap slab, dielectric memory slab, and upper cap slab form a resistive memory element.

20 Claims, 5 Drawing Sheets

(56) References Cited

U.S. PATENT DOCUMENTS

| | | |
|---|---|---|
| 2006/0054950 A1* | 3/2006 | Baek .................... H01L 45/146 257/295 |
| 2013/0077383 A1 | 3/2013 | Huang et al. |
| 2016/0013186 A1* | 1/2016 | Bae .................... H01L 29/0673 257/401 |
| 2016/0268336 A1 | 9/2016 | Shurn et al. |
| 2017/0117467 A1* | 4/2017 | Chang .................... H01L 45/16 |
| 2017/0309332 A1 | 10/2017 | Bedau |
| 2017/0331034 A1 | 11/2017 | Lv et al. |

OTHER PUBLICATIONS

Tseng et al., "High Density and Ultra Small Cell Size of Contact ReRAM (CR-RAM) in 90nm CMOS Logic Technology and Circuits", 2009 IEEE International Electron Devices Meeting. Dec. 7-9, 2009. pp. 1-4.

\* cited by examiner

COMPACT RESISTIVE RANDOM ACCESS MEMORY INTEGRATED WITH A PASS GATE TRANSISTOR

BACKGROUND

Technical Field

The present invention generally relates to resistive memory, and more particularly to a resistive random access memory arrangement.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a metal-oxide-semiconductor field effect transistor (MOSFET) with a single gate parallel with the plane of the substrate. Depending on the doping of the source and drain, an NFET or a PFET can be formed. Two FETs also can be coupled to form a complementary metal oxide semiconductor (CMOS) device, where a p-type MOSFET and n-type MOSFET are coupled together.

SUMMARY

In accordance with an embodiment of the present invention, a method of forming a resistive random access memory (ReRAM) device is provided. The method includes depositing a lower cap layer on a substrate, depositing a dielectric memory layer on the lower cap layer, and depositing an upper cap layer on the dielectric memory layer. The method further includes removing portions of the lower cap layer to form a lower cap slab, dielectric memory layer to form a dielectric memory slab on the lower cap slab, and upper cap layer to form an upper cap slab on the dielectric memory slab, wherein the lower cap slab, dielectric memory slab, and upper cap slab form a resistive memory element.

In accordance with another embodiment of the present invention, a method of forming a resistive random access memory (ReRAM) device is provided. The method includes forming a vertical fin on a substrate, and growing a source/drain on the vertical fin. The method further includes forming a source/drain contact to the source/drain. The method further includes depositing a lower cap layer on the source/drain contact, depositing a dielectric memory layer on the lower cap layer, and depositing an upper cap layer on the dielectric memory layer. The method further includes removing portions of the lower cap layer, dielectric memory layer, and upper cap layer to form a resistive memory element on the source/drain contact.

In accordance with yet another embodiment of the present invention, a resistive random access memory (ReRAM) device is provided. The device includes a vertical fin on a substrate, and a first source/drain on the vertical fin. The device further includes a first source/drain contact on the source/drain, and a lower cap slab on the first source/drain contact. The device further includes a dielectric memory slab on the lower cap slab, and an upper cap slab on the dielectric memory slab, wherein the lower cap slab, dielectric memory slab, and upper cap slab form a resistive memory element electrically coupled to the first source/drain.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the invention provide a method of fabricating a resistive memory element and pass transistor on a substrate. The resistive memory element can be electrically coupled to a source/drain of the transistor through a conductive source/drain contact to form a one transistor-one resistive element resistive random access memory (ReRAM) device.

The resistive memory element can include a refractive metal oxide layer sandwiched between two refractive metal nitride layers, where one the refractive metal nitride layers is in electrical contact with a source/drain contact. The refractive metal nitride layer can be deposited on an interlayer dielectric (ILD) layer in direct physical contact with the source/drain contact.

The resistive memory element can be fabricated as a square or rectangular device situated between a field effect transistor formed during a front end of line (FEOL) process and a first metallization layer formed during a back end of line (BEOL) process.

Exemplary applications/uses to which the present invention can be applied include, but are not limited to: memory devices, including, but not limited to, flash memory arrays, dynamic random access memory (DRAM) arrays, and static random access memory (SRAM) arrays.

It is to be understood that aspects of the present invention will be described in terms of a given illustrative architecture; however, other architectures, structures, substrate materials and process features and steps can be varied within the scope of aspects of the present invention.

Figure 1:
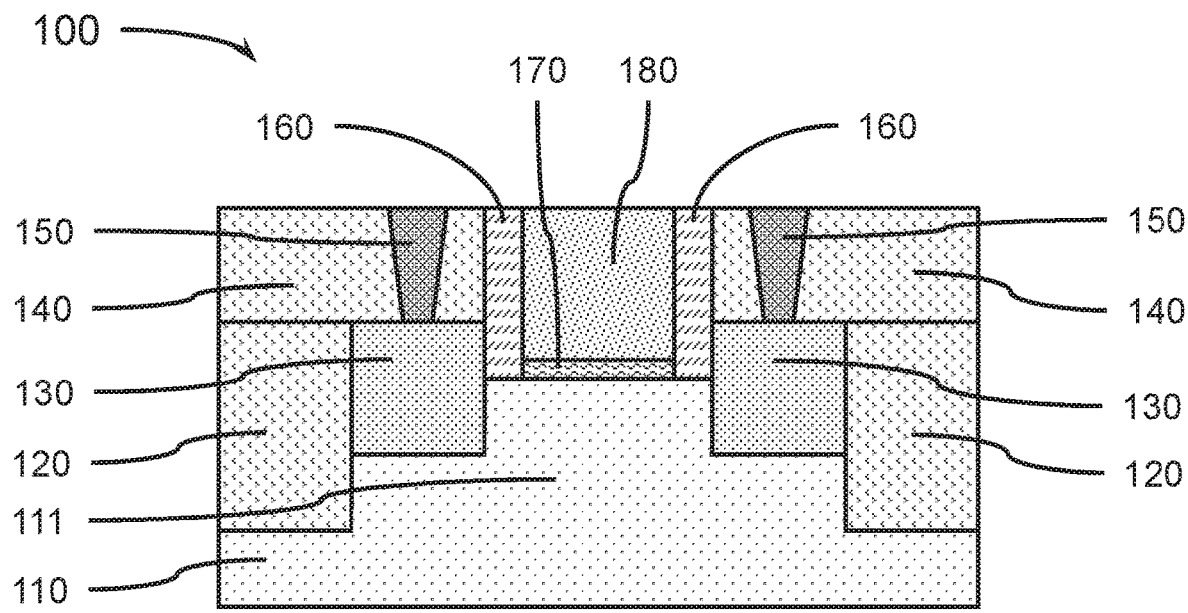
FIG. 1 is a cross-sectional side view showing a field effect transistor with source/drain contacts formed through an interlayer dielectric layer, in accordance with an embodiment of the present invention.

Referring now to the drawings in which like numerals represent the same or similar elements and initially to FIG. 1, a field effect transistor with source/drain contacts formed through an interlayer dielectric layer is shown, in accordance with an embodiment of the present invention.

In one or more embodiments, a field effect transistor device 100 can be formed on a substrate 110. The field effect transistor device 100 can be a planar metal-oxide-semiconductor field effect transistor (MOSFET), a vertical transport fin field effect transistor (VT FinFET), or a horizontal transport fin field effect transistor (HT FinFET) device. While a horizontal transport fin field effect transistor (HT FinFET) device is depicted in the drawings, this is for illustrative purposes only, and not intended to limit the scope of the invention or claims.

The field effect transistor (FET) device 100 can include a vertical fin 111, or other device channel, formed on the substrate; a gate structure including gate sidewall spacers 160, a gate dielectric layer 170, and a conductive gate electrode 180 formed on the vertical fin 111; and a source/drain 130 formed on each of the opposite sides of the gate structure. The field effect transistor device 100 can include source/drain contacts 150 formed through a lower interlayer dielectric (ILD) layer 140. Isolation regions 120 having a dielectric fill can be formed around the FET device to electrically separate neighboring devices from each other.

In various embodiments, the vertical fin 111 can be formed on the substrate 110 using patterning and etching processes including sidewall image transfer (SIT), a self-aligned double patterning (SADP) process, self-aligned triple patterning (SATP) process, or a self-aligned quadruple patterning (SAQP). The vertical fins 111 may be formed by a direct write process or double patterning process using, for example, immersion lithography, extreme ultraviolet lithography, or x-ray lithography.

In one or more embodiments, a substrate 110 can be, for example, a single crystal semiconductor material wafer or a semiconductor-on-insulator stacked wafer. The substrate 110 can include a support layer that provides structural support, and an active semiconductor layer that can form devices. An insulating layer (e.g., a buried oxide (BOX) layer) may be between the active semiconductor layer and the support layer to form a semiconductor-on-insulator substrate (SeOI) (e.g., a silicon-on-insulator substrate (SOI)), or an implanted layer can form a buried insulating material.

The support layer can include crystalline, semi-crystalline, micro-crystalline, nano-crystalline, and/or amorphous phases. The support layer can be a semiconductor (e.g., silicon (Si), silicon carbide (SiC), silicon-germanium (SiGe), germanium (Ge), gallium-arsenide (GaAs), cadmium-telluride (CdTe), etc.), an insulator (e.g.: glass (e.g. silica, borosilicate glass), ceramic (e.g., aluminum oxide ($Al_2O_3$), sapphire), plastic (e.g., polycarbonate, polyacetonitrile), metal (e.g. aluminum, gold, titanium, molybdenum-copper (MoCu) composites, etc.), or combination thereof.

The substrate 110 or active semiconductor layer can be a crystalline semiconductor, for example, a IV or IV-IV semiconductor (e.g., silicon (Si), silicon carbide (SiC), silicon-germanium (SiGe), germanium (Ge)), a III-V semiconductor (e.g., gallium-arsenide (GaAs), indium-phosphide (InP), indium-antimonide (InSb)), a II-VI semiconductor (e.g., cadmium-telluride (CdTe), zinc-telluride (ZnTe), zinc sulfide (ZnS), zinc selenide (ZnSe)), or a IV-VI semiconductor (e.g., tin sulfide (SnS), lead selenide (PbSb)).

In various embodiments, source/drains 130 can be formed on the vertical fin(s) 111, where the source/drains 130 can be formed by epitaxial growth or heteroepitaxial growth on the vertical fin surfaces. The source/drains 130 can be a crystalline semiconductor material, including, but not limited to, silicon (Si), silicon carbide (SiC), silicon-germanium (SiGe), and germanium (Ge), that can include a dopant. The dopant(s) can be an n-type dopant (e.g., phosphorus (P), arsenic (As)) or p-type dopant (e.g., boron (B), gallium (Ga)). The dopants can be introduced into the source/drains 130 during formation (i.e., in situ) or after formation (i.e., ex situ), for example, by ion implantation.

The gate structure can be formed by a gate-first process, where the gate dielectric layer 170 and conductive gate electrode 180 can be formed directly on the vertical fin 111, or a gate-last process where a dummy gate fill can be formed within the gate sidewall spacers 160 and subsequently replaced with the gate dielectric layer 170 and conductive gate electrode 180. In various embodiments, the gate structure can include a work function metal layer on the gate dielectric layer 170, as part of the conductive gate electrode 180.

In various embodiments, an interlayer dielectric (ILD) layer 140 can be formed on the vertical fin 111, source/drains 130, and gate structure. Openings can be formed in the ILD layer 140 and a source/drain contact 150 formed in the openings to each of the source/drains 130. The source/drains 130 can include silicide layers formed at the interface of a metal fill in the ILD openings and the silicon of a silicon-containing source/drain 130. In various embodiments, the source/drain contacts 150 can be a metal, for example, tungsten, ruthenium, molybdenum, cobalt, copper, aluminum, and suitable combinations thereof. In various embodiments, the source/drain contacts 150 can be tungsten (W).

In various embodiments, a chemical-mechanical polishing (CMP) can be used to provide a smooth, flat surface for the top surface of the ILD layer 140 and source/drain contacts 150.

Figure 2:
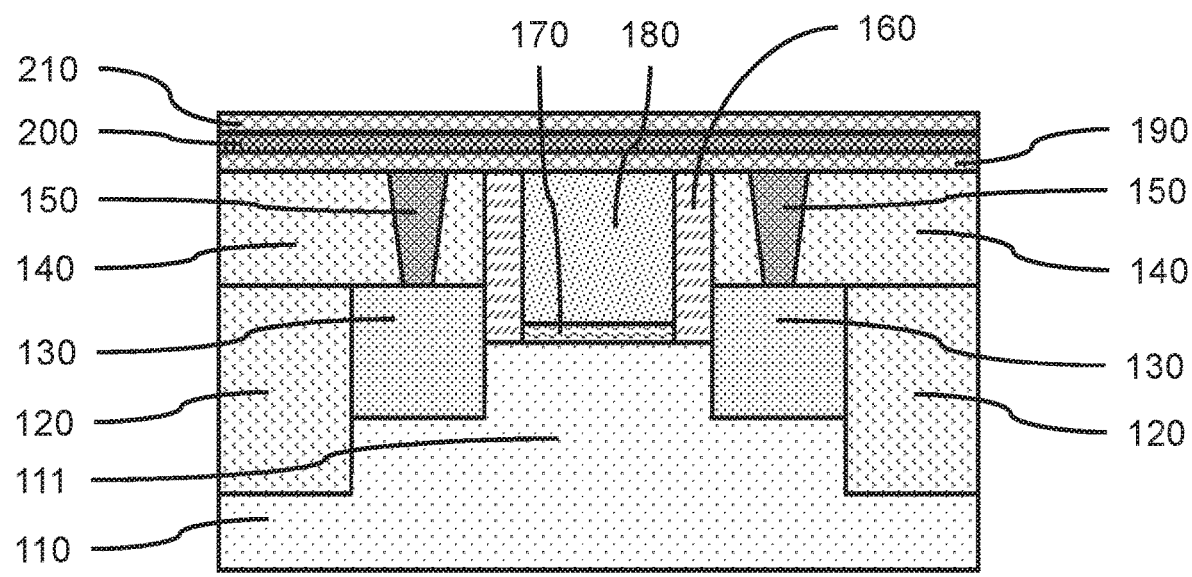
FIG. 2 is a cross-sectional side view showing a resistive memory tri-layer formed on the interlayer dielectric layer and source/drain contacts, in accordance with an embodiment of the present invention.

FIG. 2 is a cross-sectional side view showing a resistive memory tri-layer formed on the interlayer dielectric layer and source/drain contacts, in accordance with an embodiment of the present invention.

In one or more embodiments, a lower cap layer 190 can be formed on the exposed, top surface of the ILD layer 140 and source/drain contacts 150, where the lower cap layer 190 can be formed by a deposition process, including, but not limited to, atomic layer deposition (ALD), plasma enhanced ALD (PEALD), chemical vapor deposition (CVD), plasma enhanced CVD (PECVD), metal-organic CVD (MOCVD), and combinations thereof.

In various embodiments, the lower cap layer 190 can be a refractory metal nitride, for example, titanium nitride (TiN), zirconium nitride (ZrN), hafnium nitride (HfN), tantalum nitride (TaN), niobium nitride (NbN), and combinations thereof.

In various embodiments, the lower cap layer 190 can have a thickness in a range of about 2 nanometers (nm) to about 50 nm, or about 5 nm to about 15 nm, or about 10 nm, although other thicknesses are also contemplated. The lower cap layer 190 can have a thickness sufficient to act as a diffusion barrier between the underlying ILD layer 140 and source/drain contacts 150 and a subsequently formed dielectric memory layer, while providing a conductive path from the source/drain contact 150 to the dielectric memory layer.

In one or more embodiments, a dielectric memory layer 200 can be formed on the lower cap layer 190, where the dielectric memory layer 200 can be formed by a deposition process, including, but not limited to, atomic layer deposition (ALD), plasma enhanced ALD (PEALD), chemical vapor deposition (CVD), plasma enhanced CVD (PECVD), metal-organic CVD (MOCVD), and combinations thereof.

In various embodiments, the dielectric memory layer 200 can be a high-k, refractory metal oxide, for example, hafnium oxide (HfO), zirconium oxide (ZrO), lanthanum oxide (LaO), and combinations thereof.

In various embodiments, the dielectric memory layer 200 can have a thickness in a range of about 2 nanometers (nm) to about 15 nm, or about 4 nm to about 10 nm, or about 7 nm, although other thicknesses are also contemplated. The dielectric memory layer 200 can have a thickness sufficient to exhibit resistivity changes with an external bias, such as voltage, that provides a measurable change in resistance.

In one or more embodiments, an upper cap layer 210 can be formed on the exposed, top surface of the dielectric memory layer 200, where the upper cap layer 210 can be formed by a deposition process, including, but not limited to, atomic layer deposition (ALD), plasma enhanced ALD (PEALD), chemical vapor deposition (CVD), plasma enhanced CVD (PECVD), metal-organic CVD (MOCVD), and combinations thereof.

In various embodiments, the upper cap layer 210 can be a refractory metal nitride, for example, titanium nitride (TiN), zirconium nitride (ZrN), hafnium nitride (HfN), tantalum nitride (TaN), niobium nitride (NbN), and combinations thereof. The upper cap layer 210 can be the same refractory metal nitride as the lower cap layer 190, or a different refractory metal nitride.

In various embodiments, the upper cap layer 210 can have a thickness in a range of about 2 nm to about 50 nm, or about 5 nm to about 15 nm, or about 10 nm, although other thicknesses are also contemplated. The upper cap layer 210 can have a thickness sufficient to act as a diffusion barrier between the underlying dielectric memory layer 200 and a subsequently formed memory element contact, while providing a conductive path from the dielectric memory layer 200 to the memory element contact.

In one or more embodiments, the lower cap layer 190, dielectric memory layer 200, and upper cap layer 210 resistive memory tri-layer that can be patterned to form a resistive memory element electrically coupled to a FET. In various embodiments, the upper cap layer 210 and lower cap layer 190 can be the same material and the same thickness to provide symmetrical properties on both sides of the dielectric memory layer 200.

Figure 3:
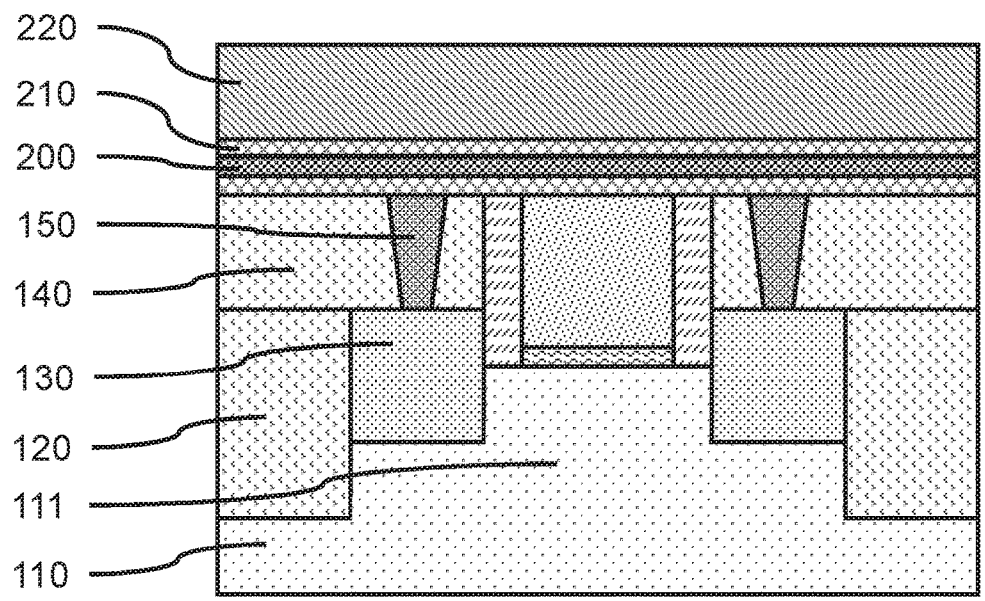
FIG. 3 is a cross-sectional side view showing a masking layer on the resistive memory tri-layer, in accordance with an embodiment of the present invention.

FIG. 3 is a cross-sectional side view showing a masking layer on the resistive memory tri-layer, in accordance with an embodiment of the present invention.

In one or more embodiments, a masking layer 220 can be formed on the upper cap layer 210, where the masking layer 220 can be formed by a deposition or spin-on process. The masking layer 220 can be a hardmask, a softmask, or a combination thereof. The hardmask can be a dielectric layer or amorphous carbon (a-C). The softmask can be a lithographic resist material that can be patterned and developed to form masking templates. In various embodiments, the masking layer 220 can be amorphous carbon (a-C).

Figure 4:
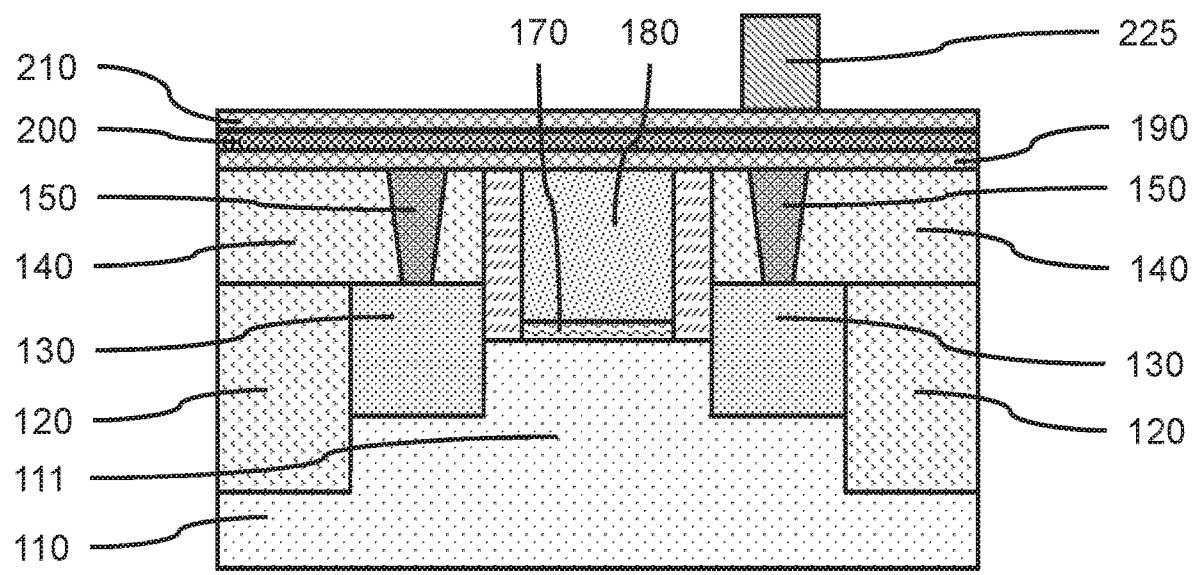
FIG. 4 is a cross-sectional side view showing a resistive element template patterned on the resistive memory tri-layer, in accordance with an embodiment of the present invention.

FIG. 4 is a cross-sectional side view showing a resistive element template patterned on the resistive memory tri-layer, in accordance with an embodiment of the present invention.

In one or more embodiments, the masking layer 220 can be patterned and developed to form a resistive element template 225 on the upper cap layer 210 using lithography and etching processes. The resistive element template 225 can be formed above one of the source/drain contacts 150, where the resistive element template 225 can be configured and dimensioned for forming a resistive memory element on the source/drain contact 150. Formation of the resistive element template 225 can expose portions of the upper cap layer 210 over other portions of the field effect transistor device 100.

In various embodiments, the resistive element template 225 can have a width in a range of about 40 nm to about 1000 nm, or about 60 nm to about 500 nm, or about 50 nm to about 100 nm, although other widths are also contemplated. In various embodiments, the resistive element template 225 can have a length in a range of about 40 nm to about 1000 nm, or about 60 nm to about 500 nm, or about 50 nm to about 100 nm, although other lengths are also contemplated. The resistive element template 225 can have a square or rectangular shape on the upper cap layer 210.

Figure 5:
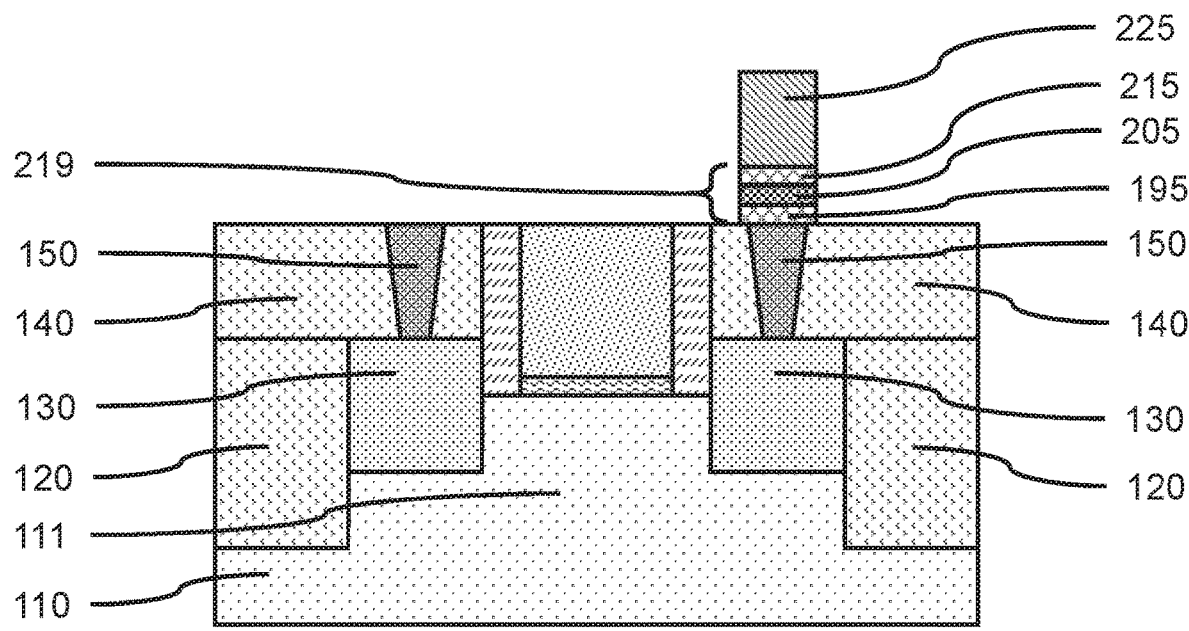
FIG. 5 is a cross-sectional side view showing a resistive element template on a patterned resistive memory tri-layer, in accordance with an embodiment of the present invention.

FIG. 5 is a cross-sectional side view showing a resistive element template on a patterned resistive memory tri-layer, in accordance with an embodiment of the present invention.

In one or more embodiments, the exposed portions of the underlying upper cap layer 210 can be removed using a selective directional etch (e.g., reactive ion etch (RIE)). Removal of the exposed portions of the underlying upper cap layer 210 can expose underlying portions of the dielectric memory layer 200, which can be removed using a selective directional etch to expose the underlying lower cap layer 190. The exposed portions of the lower cap layer 190 can be removed to expose the lower interlayer dielectric (ILD) layer 140, and one of the source/drain contacts 150.

Removal of portions of the upper cap layer 210, dielectric memory layer 200, and lower cap layer 190 can leave a resistive memory element 219 under the resistive element template 225. Removal of the exposed portions of the upper cap layer 210 can form an upper cap slab 215 under the resistive element template 225. Removal of the exposed portions of the dielectric memory layer 200 can form a dielectric memory slab 205 under the upper cap slab 215. Removal of the exposed portions of the lower cap layer 190 can form a lower cap slab 195 under the dielectric memory slab 205. The upper cap slab 215, dielectric memory slab 205, and lower cap slab 195 can form a resistive memory element 219. The resistive memory element 219 can be positioned above and in electrical connection with a source/drain contact 150. In various embodiments, the resistive memory element 219 can be in direct contact with the source/drain contact 150.

In various embodiments, the resistive memory element 219 can cover a surface area of about 100 nm² to about 500,000 nm², or about 100 nm² to about 100,000 nm², or about 500 nm² to about 500,000 nm², or about 500 nm² to about 50,000 nm², where the area of the resistive element template 225 can be the same.

Figure 6:
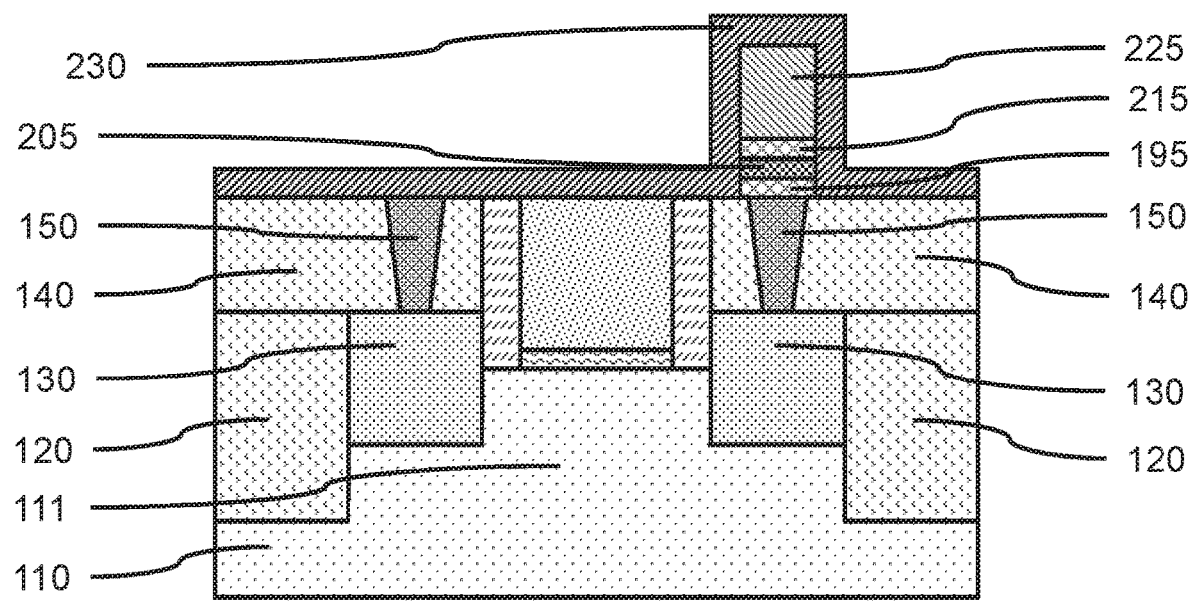
FIG. 6 is a cross-sectional side view showing a protective liner on the resistive element template and patterned resistive memory tri-layer, in accordance with an embodiment of the present invention.

FIG. 6 is a cross-sectional side view showing a protective liner on the resistive element template and patterned resistive memory tri-layer, in accordance with an embodiment of the present invention.

In one or more embodiments, a protective liner 230 can be formed on the resistive element template 225 and resistive memory element 219, where the protective liner 230 can be formed by a conformal deposition, for example, ALD, PEALD, and combinations thereof.

In various embodiments, the protective liner 230 can be a dielectric material, including, but not limited to, silicon nitride (SiN), silicon oxynitride (SiON), silicon boronitride (SiBN), silicon boro carbonitride (SiBCN), silicon carbonitride (SiCN), silicon oxycarbonitride (SiOCN), and combinations thereof. The protective liner 230 can protect the resistive element template 225 and resistive memory element 219 during processing of an upper interlayer dielectric (ILD) layer.

In various embodiments, the protective liner 230 can have a thickness in a range of about 10 nm to about 100 nm, or about 20 nm to about 30 nm, where the thickness can be sufficient to protect the resistive element template 225 and resistive memory element 219 during etching of the upper interlayer dielectric (ILD) layer.

Figure 7:
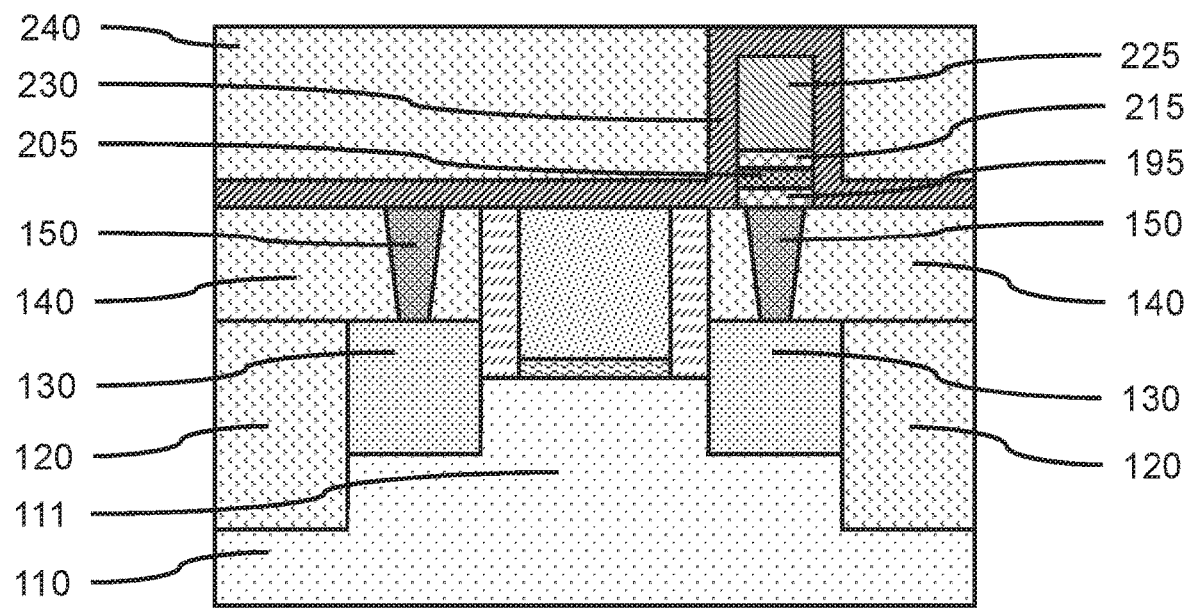
FIG. 7 is a cross-sectional side view showing an upper interlayer dielectric (ILD) layer on the protective liner and patterned resistive memory tri-layer, in accordance with an embodiment of the present invention.

FIG. 7 is a cross-sectional side view showing an upper interlayer dielectric (ILD) layer on the protective liner and patterned resistive memory tri-layer, in accordance with an embodiment of the present invention.

In one or more embodiments, an upper interlayer dielectric (ILD) layer 240 can be formed on the protective liner 230, where the upper interlayer dielectric (ILD) layer 240 can be formed by a deposition, spin-on process, or combination thereof.

In various embodiments, the upper interlayer dielectric (ILD) layer 240 can cover the protective liner 230, and a CMP can be used to reduce the height of the upper ILD layer 240 to expose the top surface of the protective liner 230 on the resistive element template 225.

Figure 8:
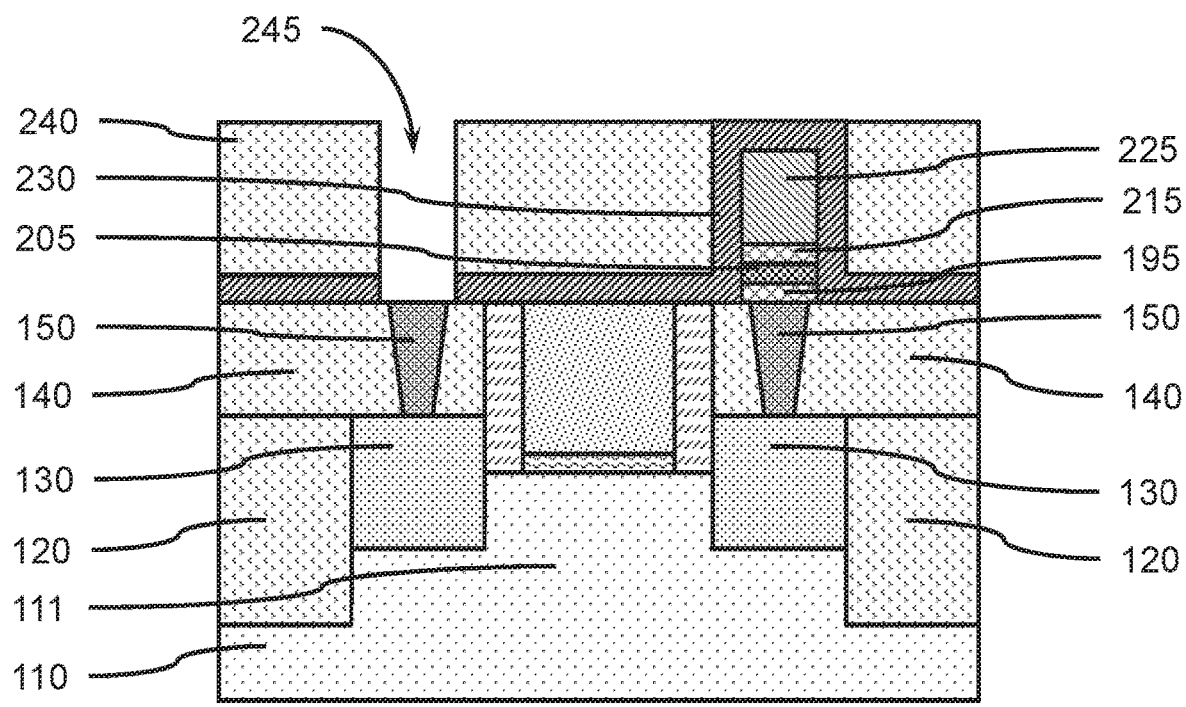
FIG. 8 is a cross-sectional side view showing a trench formed in the upper interlayer dielectric layer and protective liner to a source/drain contact, in accordance with an embodiment of the present invention.

FIG. 8 is a cross-sectional side view showing a trench formed in the upper interlayer dielectric layer and protective liner to a source/drain contact, in accordance with an embodiment of the present invention.

In one or more embodiments, the exposed surface of the upper ILD layer 240 can be masked, patterned, and etched to form a trench 245 through the ILD layer 240 and protective liner 230 to the source/drain contact 150 not covered by the resistive memory element 219.

Figure 9:
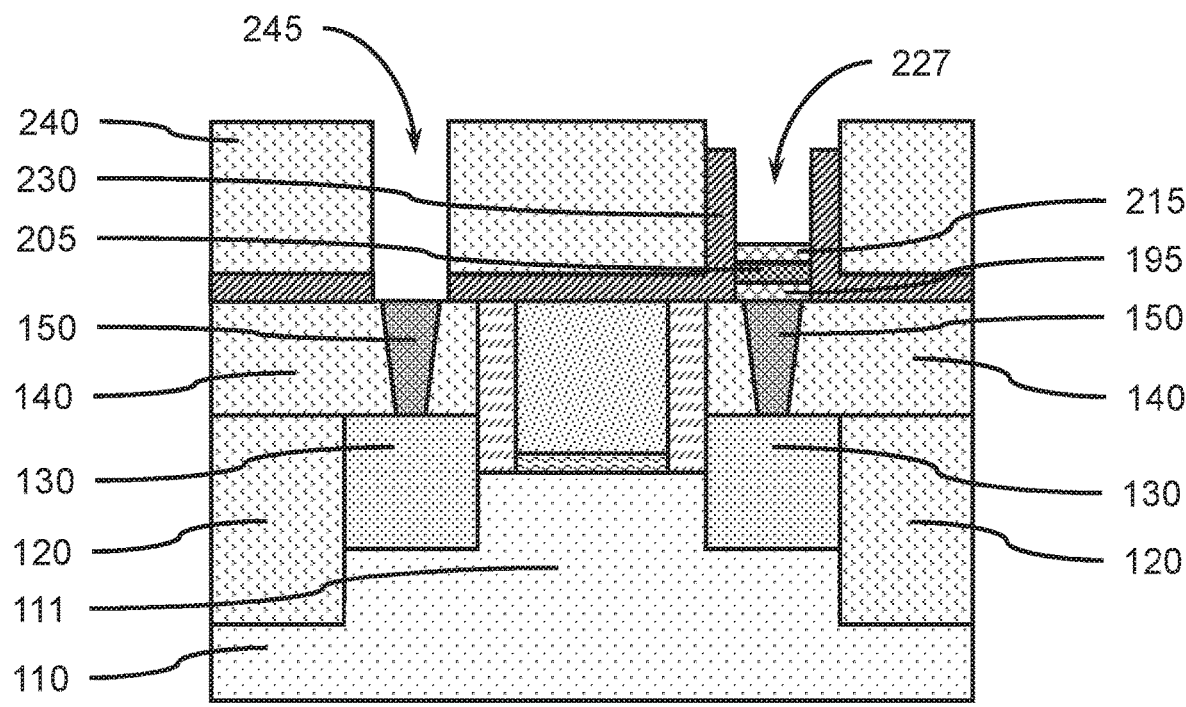
FIG. 9 is a cross-sectional side view showing the protective liner opened up and the resistive element template removed, in accordance with an embodiment of the present invention.

FIG. 9 is a cross-sectional side view showing the protective liner opened up and the resistive element template removed, in accordance with an embodiment of the present invention.

In one or more embodiments, the portion of the protective liner exposed in the upper ILD layer 240 can be removed using a selective etch (e.g., wet chemical etch, dry plasma etch) to expose the resistive element template 225, where upright portions of the protective liner 230 can remain on the sidewalls of the resistive element template 225. The resistive element template 225 can be removed using a selective etch (e.g., wet chemical etch, dry plasma etch) to form a cavity 227 exposing an upper cap slab 215 of the resistive memory element 219 between upright portions of the protective liner 230.

Figure 10:
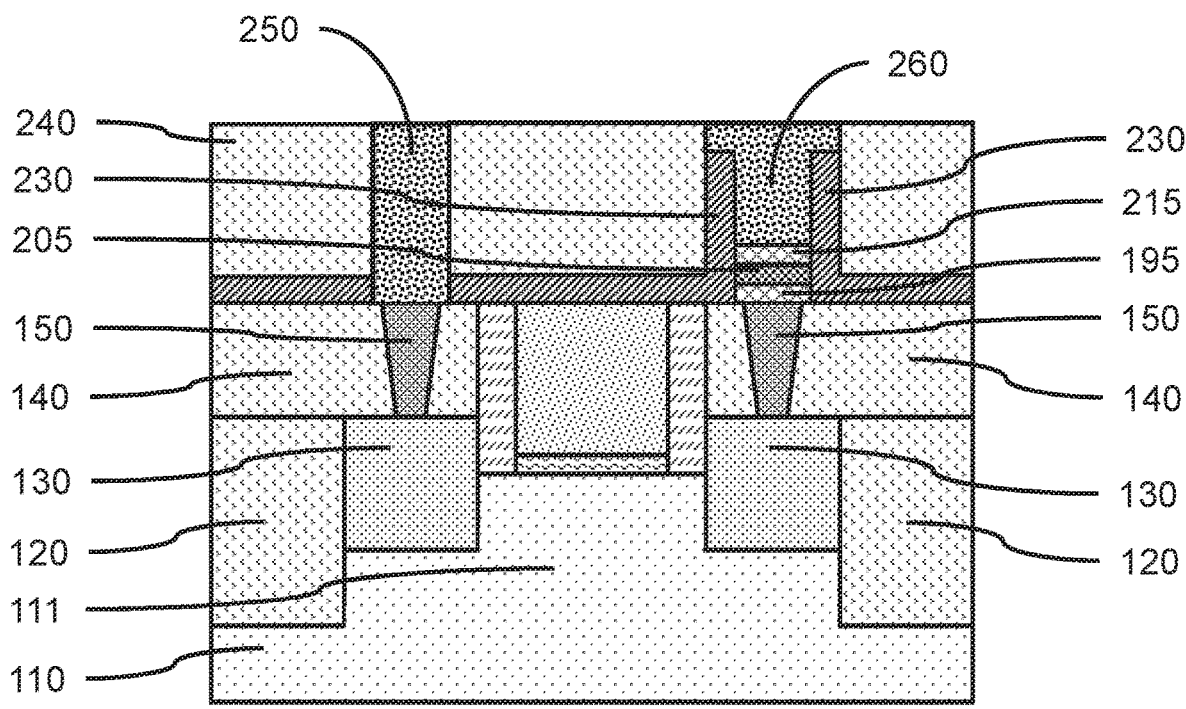
FIG. 10 is a cross-sectional side view showing conductive contacts formed to the source/drain contact and resistive memory element, in accordance with an embodiment of the present invention.

FIG. 10 is a cross-sectional side view showing conductive contacts formed to the source/drain contact and resistive memory element, in accordance with an embodiment of the present invention.

In one or more embodiments, a conductive contact 250 can be formed to the source/drain contact 150, and a memory element contact 260 can be formed to the upper cap slab 215 of the resistive memory element 219. The conductive contact 250 and memory element contact 260 can be formed by a deposition on the upper ILD layer 240, and a CMP to remove contact material on or above the surface of the upper ILD layer 240.

The conductive contact 250 and memory element contact 260 can be a conductive material including, but not limited to, a metal (e.g., tungsten, titanium, tantalum, ruthenium, zirconium, molybdenum, cobalt, copper, aluminum, platinum, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotubes, conductive carbon, graphene, or any suitable combination of these materials. The conductive contact 250 and memory element contact 260 can include a barrier liner on the sidewalls of the trench 245 and cavity 227, where the barrier liner can be a refractory metal nitride (e.g., TiN, TaN, etc.) or refractory metal carbide (e.g., TiC, TaC, etc.) formed by ALD or PEALD.

In various embodiments, the field effect transistor device 100 can control the flow of current through the resistive memory element 219 and/or applied voltage to change the state of the resistive memory element.

In various embodiments, the resistive memory element 219 can be programmed by flowing a current through the dielectric memory slab 205, or applying a voltage bias across the dielectric memory slab 205. The field effect transistor device 100 can control the current flow or voltage bias through a voltage applied to the gate structure, where the field effect transistor device 100 can be addressed by a memory access controller. The resistivity of the resistive memory element 219 can be measured to determine whether a "0" or "1" is stored in the dielectric memory slab 205.

It will be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other e rets or features. Thus, the term "below" can encompass both an ion of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and fabrication method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A resistive random access memory (ReRAM) device, comprising:
   a vertical fin on a substrate;
   a gate dielectric layer on the vertical fin;
   a conductive gate electrode on the gate dielectric layer, wherein the conductive gate electrode has a top surface;
   a first source/drain on the vertical fin;
   a first source/drain contact on the first source/drain, wherein the first source/drain contact has a top surface coplanar with the top surface of the conductive gate electrode;
   a lower cap slab on the first source/drain contact;
   a dielectric memory slab on the lower cap slab; and
   an upper cap slab on the dielectric memory slab, wherein the lower cap slab, dielectric memory slab, and upper cap slab form a resistive memory element electrically coupled to the first source/drain.

2. The ReRAM device of claim 1, wherein the lower cap layer and upper cap layer each have a thickness in a range of about 2 nanometers (nm) to about 50 nm.

3. The ReRAM device of claim 1, wherein the dielectric memory layer has a thickness in a range of about 2 nm to about 15 nm.

4. The ReRAM device of claim 1, further comprising a second source/drain on the vertical fin, and a second source/drain contact on the second source/drain, wherein the second source/drain is on an opposite side of the conductive gate electrode from the first source/drain.

5. The ReRAM device of claim 4, further comprising a lower interlayer dielectric (ILD) layer on the vertical fin, first and second source/drains, and the first and second source/drain contacts, wherein the lower interlayer dielectric (ILD) layer is between the lower cap slab and first source/drain, and has a top surface coplanar with the top surface of conductive gate electrode.

6. The ReRAM device of claim 5, wherein the material of the dielectric memory layer is selected from the group consisting of hafnium oxide (HfO), zirconium oxide (ZrO), lanthanum oxide (LaO), and combinations thereof.

7. The ReRAM device of claim 6, wherein the material of the lower cap layer and upper cap layer are each selected from the group consisting of titanium nitride (TiN), zirconium nitride (ZrN), hafnium nitride (HfN), tantalum nitride (TaN), niobium nitride (NbN), and combinations thereof.

8. The ReRAM device of claim 7, further comprising a memory element contact on the upper cap slab of the resistive memory element.

9. The ReRAM device of claim 8, wherein the resistive memory element covers a surface area of about 500 nm$^2$ to about 50,000 nm$^2$.

10. A resistive random access memory (ReRAM) device, comprising:
a vertical fin on a substrate;
a gate dielectric layer on the vertical fin;
a conductive gate electrode on the gate dielectric layer, wherein the conductive gate electrode has a top surface;
a first source/drain on the vertical fin;
a lower interlayer dielectric (ILD) layer on the vertical fin and first source/drain, wherein the lower interlayer dielectric layer has a top surface coplanar with the top surface of conductive gate electrode;
a first source/drain contact on the first source/drain, wherein the first source/drain contact has a top surface coplanar with the top surface of the conductive gate electrode, and wherein the first source/drain contact is within the lower interlayer dielectric (ILD) layer;
a lower cap slab on the first source/drain contact and the lower interlayer dielectric (ILD) layer;
a dielectric memory slab on the lower cap slab; and
an upper cap slab on the dielectric memory slab, wherein the lower cap slab, dielectric memory slab, and upper cap slab form a resistive memory element electrically coupled to the first source/drain.

11. The ReRAM device of claim 10, further comprising a protective liner directly on the top surface of the conductive gate electrode, the resistive memory element and the lower ILD layer.

12. The ReRAM device of claim 11, wherein a top surface of the lower ILD layer and a top surface of the first source/drain contact are coplanar.

13. The ReRAM device of claim 12, wherein the first source/drain contact is a metal selected from the group consisting of tungsten, ruthenium, molybdenum, cobalt, copper, aluminum, and combinations thereof.

14. The ReRAM device of claim 13, wherein the material of the lower cap layer is selected from the group consisting of titanium nitride (TiN), zirconium nitride (ZrN), hafnium nitride (HfN), tantalum nitride (TaN), niobium nitride (NbN), and combinations thereof.

15. The ReRAM device of claim 14, wherein the upper cap layer and lower cap layer are the same material and the same thickness to provide symmetrical properties.

16. A resistive random access memory (ReRAM) device, comprising:
a vertical fin on a substrate;
a gate structure on the vertical fin;
a first source/drain on the vertical fin adjoining the gate structure;
a first source/drain contact directly on the first source/drain;
a second source/drain on the vertical fin, wherein the second source/drain is on the opposite side of the gate structure from the first source/drain;
a lower cap slab directly on the first source/drain contact;
a dielectric memory slab on the lower cap slab;
an upper cap slab on the dielectric memory slab, wherein the lower cap slab, dielectric memory slab, and upper cap slab form a resistive memory element electrically coupled to the first source/drain; and
a protective liner in direct contact with a top surface of the gate structure and on the resistive memory element.

17. The ReRAM device of claim 16, further comprising a second source/drain contact on the second source/drain, wherein a top surface of the first source/drain contact is coplanar with a top surface of the second source/drain contact.

18. The ReRAM device of claim 17, further comprising a lower interlayer dielectric (ILD) layer between the first source/drain and the lower cap slab.

19. The ReRAM device of claim 18, wherein the material of the lower cap slab and upper cap slab are each selected from the group consisting of titanium nitride (TiN), zirconium nitride (ZrN), hafnium nitride (HfN), tantalum nitride (TaN), niobium nitride (NbN), and combinations thereof, and wherein the material of the dielectric memory layer is selected from the group consisting of hafnium oxide (HfO), zirconium oxide (ZrO), lanthanum oxide (LaO), and combinations thereof.

20. The ReRAM device of claim 19, further comprising a memory element contact on the upper cap slab, wherein the protective liner is on at least a portion of the memory element contact, and wherein the resistive memory element has a width in a range of about 40 nm to about 1000 nm, and a length in a range of about 40 nm to about 1000 nm.

* * * * *